United States Patent [19]
Heiney et al.

[11] Patent Number: 5,673,209
[45] Date of Patent: Sep. 30, 1997

[54] APPARATUS AND ASSOCIATED METHOD FOR COMPRESSING AND DECOMPRESSING DIGITAL DATA

[75] Inventors: Ronald L. Heiney, Longmont; Keith E. Duvall, Niwot; Anthony F. Stuart, Jamestown; Claude A. Bugg, Boulder; Gregory S. Felderman, Westminster; Steven M. Scott, Lafayette, all of Colo.

[73] Assignee: International Business Machines Corporation, Armonk, N.Y.

[21] Appl. No.: 413,057

[22] Filed: Mar. 29, 1995

[51] Int. Cl.⁶ .................. G06F 7/00; G06F 15/00
[52] U.S. Cl. .......... 364/715.02; 341/51; 341/67; 358/426; 375/240; 382/166; 382/232; 382/244; 395/888
[58] Field of Search .............. 364/715.02, 722; 341/51, 67; 382/166, 232, 233, 244–246; 358/426; 395/888, 375; 375/240

[56] References Cited

U.S. PATENT DOCUMENTS

| | | | |
|---|---|---|---|
| 3,656,178 | 4/1972 | De Maine et al. | 395/375 |
| 4,748,577 | 5/1988 | Marchant | 364/722 |
| 4,903,317 | 2/1990 | Nishihara et al. | 382/56 |
| 4,916,544 | 4/1990 | Lienard et al. | 358/262.1 |
| 4,955,066 | 9/1990 | Notenboom | 382/56 |
| 5,007,102 | 4/1991 | Haskell | 382/56 |
| 5,109,437 | 4/1992 | Honda | 382/56 |
| 5,150,430 | 9/1992 | Chu | 382/56 |
| 5,185,820 | 2/1993 | Miyata | 382/56 |
| 5,220,649 | 6/1993 | Forcier | 395/148 |
| 5,245,678 | 9/1993 | Eschbach et al. | 382/50 |
| 5,272,768 | 12/1993 | Bauman | 395/110 |
| 5,533,051 | 7/1996 | James | 375/240 |

*Primary Examiner*—Reba I. Elmore
*Assistant Examiner*—Emmanuel L. Moise
*Attorney, Agent, or Firm*—Holland & Hart

[57] ABSTRACT

A data compression and decompression technique compresses a binary stream of digital data into compressed form and decompresses a compressed data stream into decompressed form without any loss of fidelity. The techniques require very little processing time to permit compression and decompression of digital data quickly. Once the digital data is compressed into compressed form, the amount of memory required to store the compressed digital data is much less than the amount of memory required to store the corresponding data in uncompressed form.

20 Claims, 5 Drawing Sheets

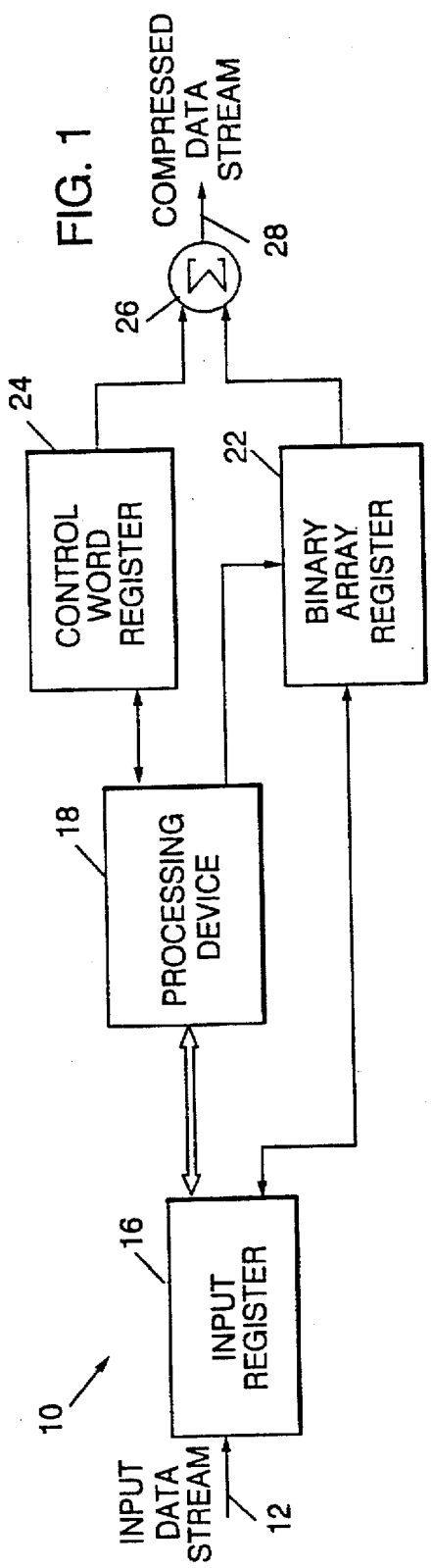
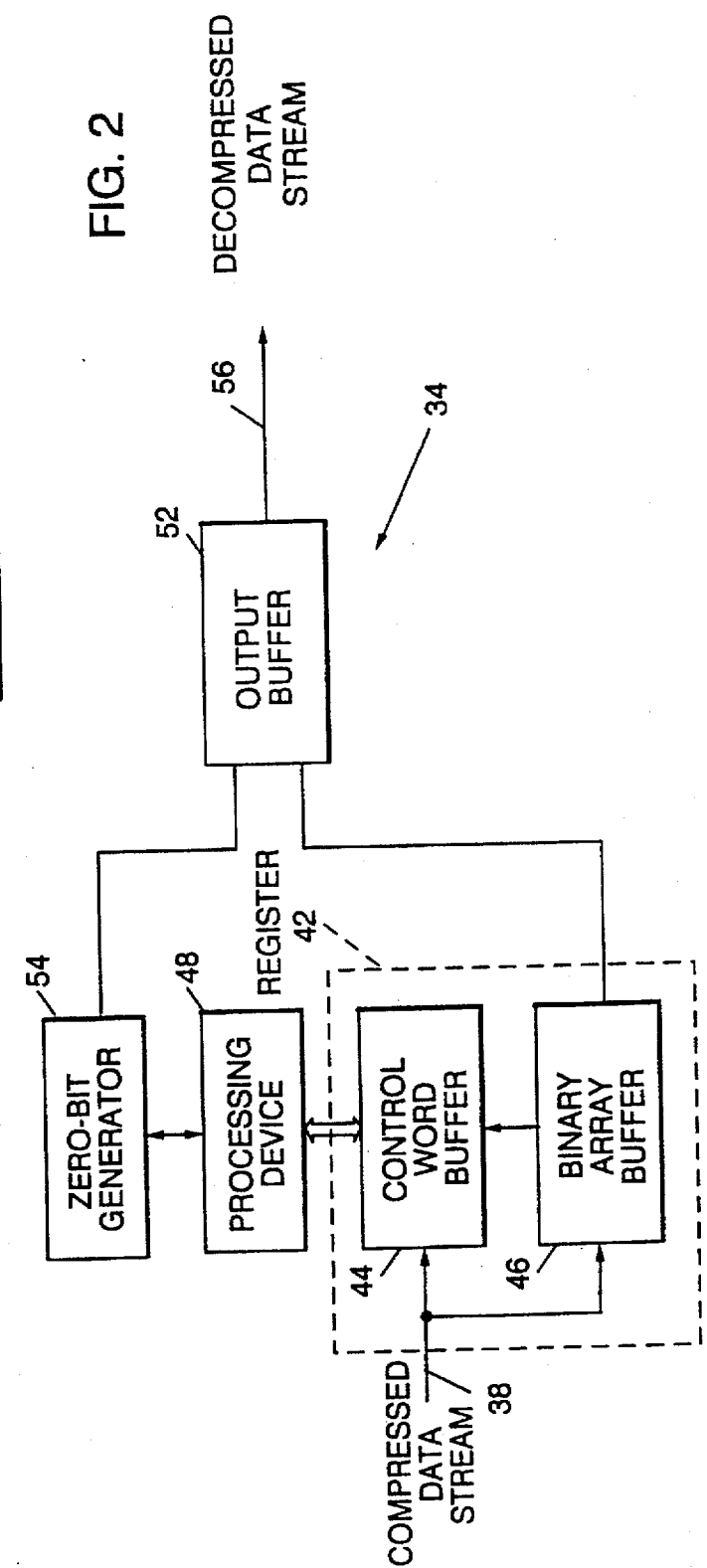

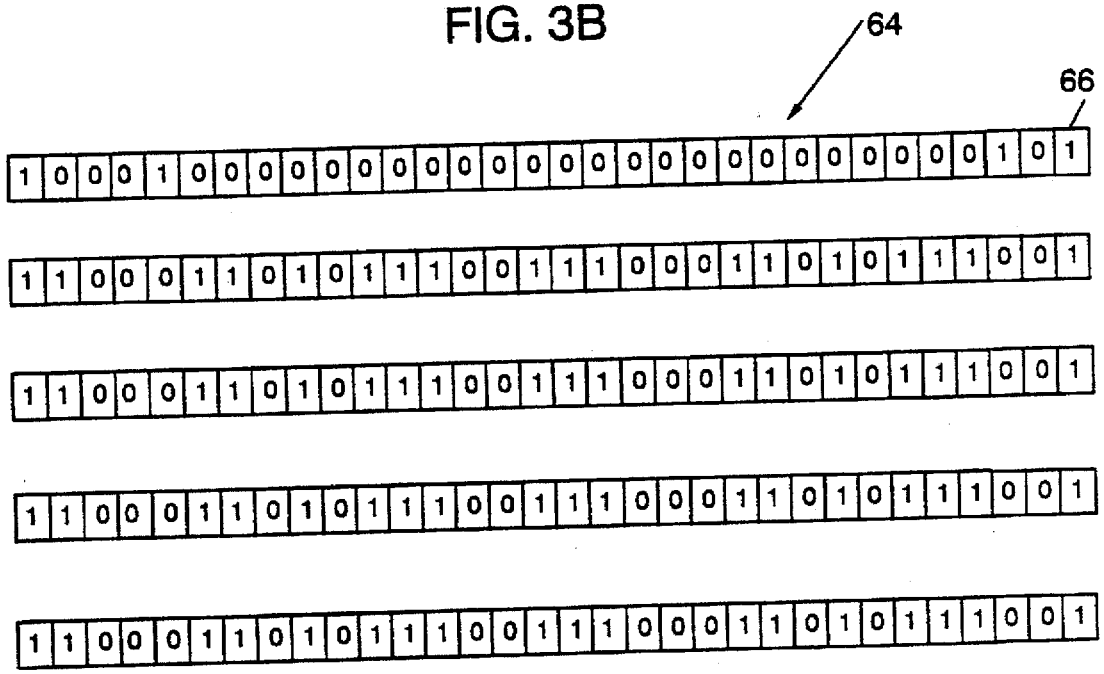

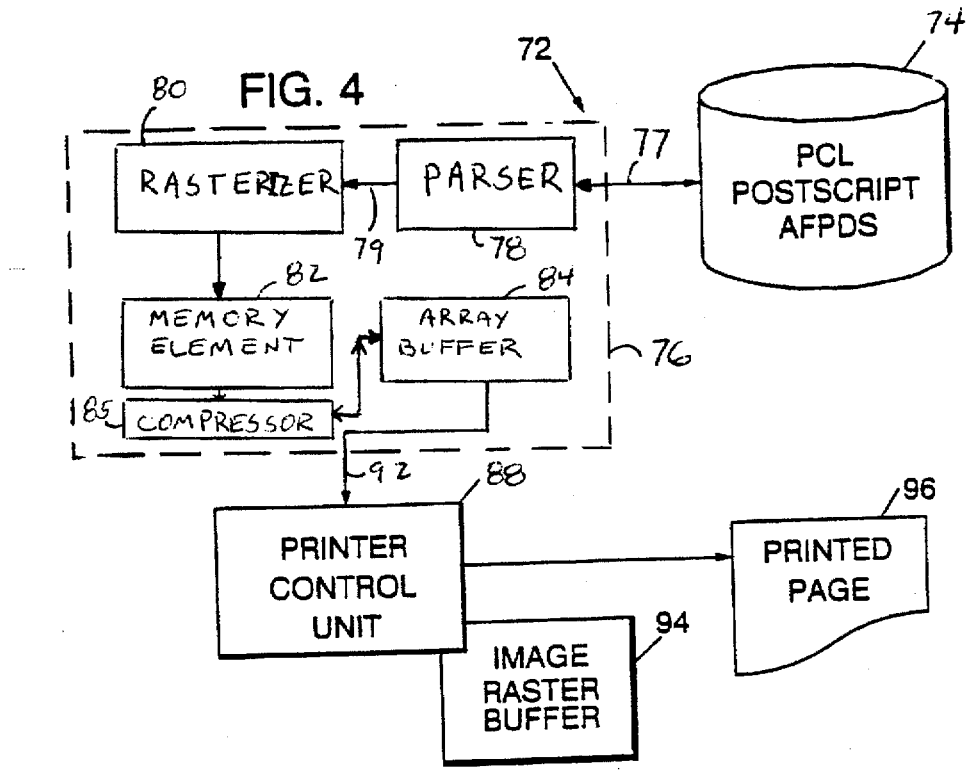
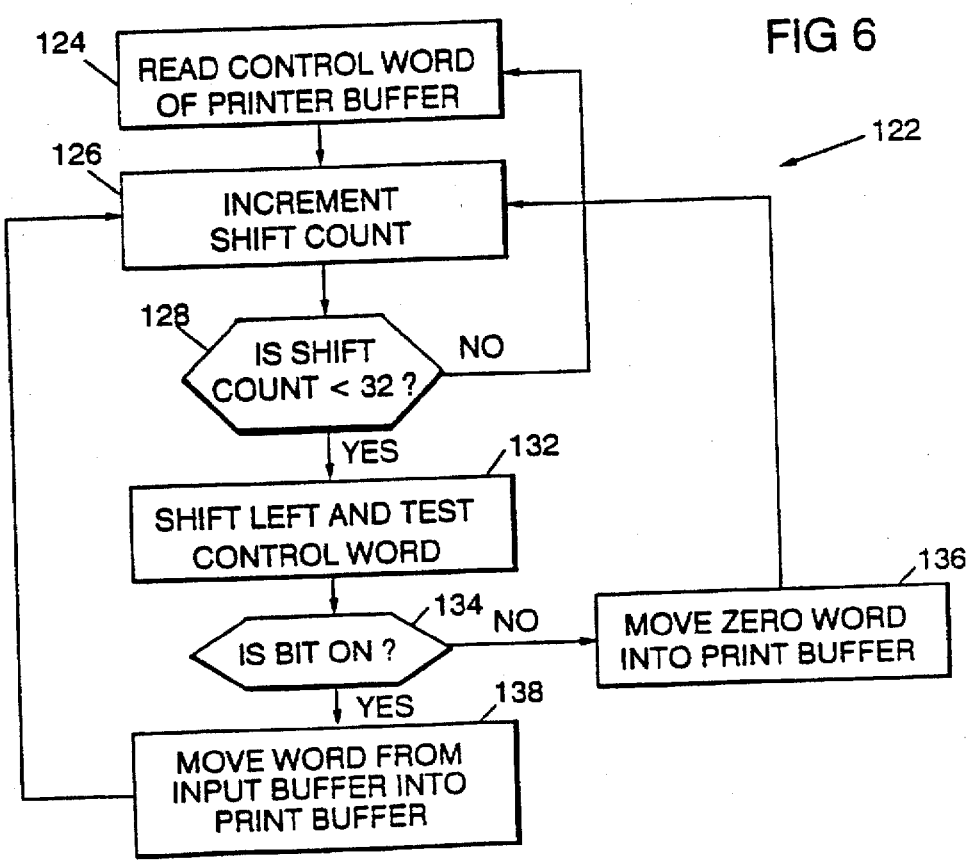

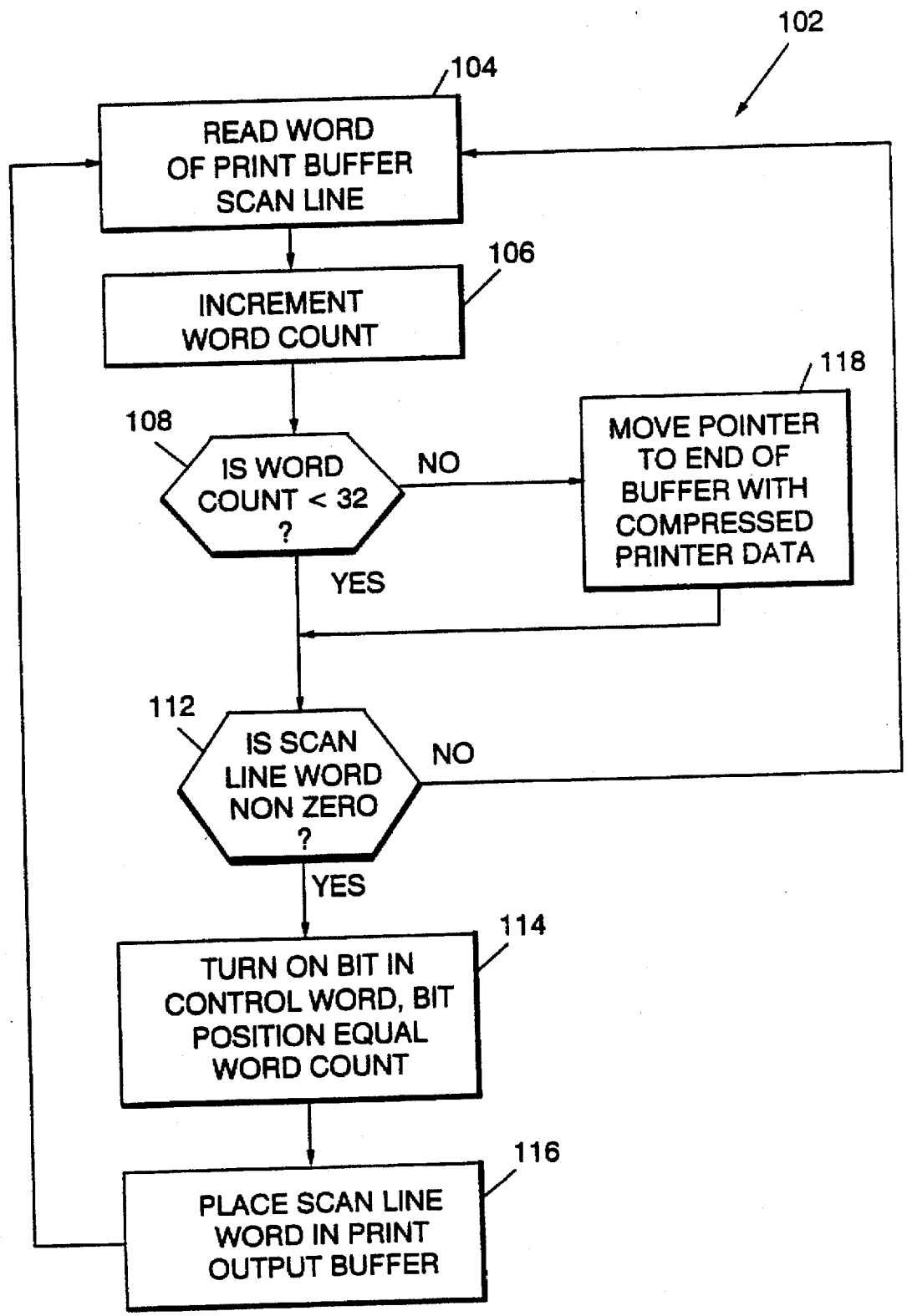

APPARATUS AND ASSOCIATED METHOD FOR COMPRESSING AND DECOMPRESSING DIGITAL DATA

BACKGROUND OF THE INVENTION

1. Field Of The Invention

The present invention relates generally to a compression technique for compressing digital data into a compressed form. More particularly, the present invention relates to a data compression and decompression technique requiring only minimal processing of the data.

2. Description Of Related Art

A printing operation is an example of an information technology which could use compressed digital data to its advantage. In a conventional printing operation the data to be printed onto the print medium is stored in appropriate memory, usually referred to as a print buffer, during the printing operation. The data to be printed onto the print media may also have been previously stored in an appropriate memory, such as a page memory, and is copied therefrom to the print buffer during the printing operation. The storage requirements for the data in memory both before and during the printing operation can be greatly reduced if the data is compressed.

A conventional printing operation oftentimes involves the printing of a raster image. A raster image is formed of a plurality of pixels (picture elements) and can be represented by a bit map defined by digital data. The digital data defining the bit map can be manipulated, transmitted, and stored, as desired. The amount of digital data required to define the bit map can, however, be very large. A suitable amount of memory must be available to store the bit map. And, when bit maps representing many raster images must be stored, the amount of memory required to store all of the bit maps can quickly become inordinately expensive or otherwise impractical.

Various compression techniques are known for compressing digital data into compressed form. For instance, Huffman coding, Shannon-Fano, coding MPEG (Motion Picture Experts Group) coding, and JPEG (Joint Photo Experts Group) coding are all examples of compression techniques for compressing digital data. Compression of digital data, without loss of fidelity, is usually possible for the reason that the digital data oftentimes includes redundant data. By removing the redundancies out of the data, the information content of the data remains unchanged, but the amount of digital data is reduced.

Existing data compression techniques, however, require a relatively significant amount of data processing to compress the data. Further to decompress the data, a corresponding large amount of data processing is required. Such processing requires a relatively lengthy time period, and therefore, the compression and decompression of the data can not keep up with the rasterizer used to display or print the raster image.

SUMMARY OF THE INVENTION

An object of the present invention is to provide a compression and decompression technique for compressing and decompressing digital data without requiring a significant amount of data processing or processing time.

A second object of this invention is to provide a technique for efficiently storing bit maps utilized in raster image operations such as printing operations.

In accordance with the present invention, the above problems are solved and the above objects are accomplished by a method, or apparatus, for compressing an input data stream into compressed data by detecting data word bits and based on the bit detection, indexing the data word relative to a control word and for decompressing the compressed data by detecting bits in the control word to retrieve indexed data words and thereby to produce an output data stream. The input data stream is formed of at least one input digital word, and each input digital word is formed of at least one signal bit. The input data stream is compressed into a compressed data stream formed of at least a control word. The bit values of the signal bits of the input digital words of the input data stream are determined. When an input digital word of the input data stream includes at least one bit of a first logical value, the input digital word is concatenated or otherwise linked to the control word of the compressed data stream to form a portion thereof. Each bit of the control word is associated with a different input digital word of the input data stream, and a bit of the control word associated with the input digital word is marked with a first selected value. When the input digital word of the input data stream includes bits of only a second logical value, the bit of the control word associated with the input digital word is marked with a second selected value. Thereby, the compressed data stream is formed of the control word and input digital words, which have at least one bit of the first logical value, being indexed relative to the control word.

In the data decompression method or logical apparatus operation, the control word of the compressed data stream is read. A determination is made as to which bits of the control word are of first selected values and which bits of the control word are of second selected values. When the bit of the control word is of the first selected value, a subsequent data word in the compressed data stream, which word is indexed relative to the control word, is read. The subsequent data word's location in the data stream relative to the control word is defined by the position in the control word of bit of first selected value. When the bit of the control word is of the second selected value, an output digital word formed of bits, all of second logical values, is generated. The output data stream is thereby formed of values responsive to values of the control word.

Because only a small amount of processing is required to compress the data into the compressed form, compression of the data can be effectuated quickly, thereby to permit increased amounts of other processing functions to be performed and to permit the movement of data into and out of memory or buffers to keep up with the displaying or printing of the raster image. Decompression of the compressed digital data is similarly effectuated without a significant amount of processing. The data can be compressed to reduce redundancy of a data stream and later decompressed to reintroduce the redundancies without any loss of fidelity or loss of time.

Compression of the digital data according to the teachings of the present invention is particularly advantageous when storing large amounts of digital data, such as digital data forming a bit map used in the creation of raster images. By compressing the data into the compressed form, the amount of memory storage required to store any particular bit map is reduced. When significant numbers of bit maps are to be stored, such as when the image rasters are to be used in high speed printing operations, the memory savings can become quite significant.

Also, because the compressed digital data can be decompressed quickly and without the need for significant amounts of processing, use of the compression and decompression technique is particularly beneficial in high-speed printing operations. Compressed data representative of bit maps forming printer images can be stored in memory elements and thereafter transferred to a print resource, when desired. As the data is received at the print resource, the data can be decompressed and utilized to form print images upon print media without delay due to decompression processing.

A more complete appreciation of the present invention and the scope thereof can be obtained from the accompanying drawings which are briefly summarized below, the following detailed description of the presently preferred embodiments of the invention, and the appended claims.

BRIEF DESCRIPTION OF THE DRAWINGS

FIG. 1 is a functional block diagram of a compression circuit of an embodiment of the present invention for compressing a digital data stream.

FIG. 2 is a functional block diagram of a decompression circuit of an embodiment of the present invention for decompressing a compressed data stream.

FIG. 3, comprising FIGS. 3A and 3B illustrates an example of an uncompressed digital data stream and a compressed digital data stream formed therefrom responsive to operation of the compression technique of the present invention.

FIG. 4 is a functional block diagram of a printing system which utilizes the data compression and decompression technique of an embodiment of the present invention.

FIG. 5 is a logical flow diagram illustrating a method for effectuating the compression technique of an embodiment of the present invention.

FIG. 6 is a logical flow diagram illustrating a method for effectuating the decompression technique of an embodiment of the present invention.

DETAILED DESCRIPTION

With reference first to FIG. 1, a compression circuit, shown generally at 10, is operative to compress a digital data stream to form a compressed digital data stream. The compression circuit 10 compresses the digital data of the input digital data stream by removing redundancies contained in the input data stream.

An input data stream generated on line 12 is applied to an input register 16. In one embodiment, the input data stream is formed of a series of input data words, in which each data word is of a bit size of thirty-two bits. The input register 16 is of a size great enough to receive at least one entire input data word of the input data stream and, in such an embodiment, is formed of a thirty-two bit register to receive a thirty-two bit word therein.

A processing device 18 is coupled to the input register 16 and is operative to determine when an input data word input into the input register 16 contains at least one non-zero bit.

When the processing device 18 determines that at least one bit of the input data word stored in the input register 16 is of a non-zero value, the input data word stored in the input register 16 is transferred to the binary array register 22, and a succeeding input data word is input into the register 16.

A control word register 24 contains a control word having a selected number of bits, here thirty-two bits corresponding to the thirty-two bit word size of the input data words of the input data stream. The control word is initially formed of all-zero bits.

When the processing device 18 determines that the input data word in the input register 16 includes at least one non-zero bit, the processing device 18 also causes a selected bit of the control word contained in the control word register 24 to be marked with a logical one value. The first input data word which is input into the input register 16 is associated with a most significant bit of the control word. Succeeding input data words inserted into the input register 16 are associated with successively less significant bits of the control word.

As successive input data words are input into the input register 16, the processing device 18 determines whether the successive ones of the input data words contain non-zero bits. When an input data word includes a non-zero bit, the data word is transferred from the input register 16 to the binary array register 22 to be concatenated to any data words previously stored in the register 22, and a bit in the control word contained in the control word register 24 is marked with a logical one value. The marked bit corresponds in position in the control word to the same position of the data word in the data stream relative to the control word. Thus the non-zero bits in the control word serve as an index to the data words in the input data stream that contain non-zero bits.

In the example in which the control word contained within the control word register 24 is of a bit size of thirty-two bits, the control word forms a binary index for indexing thirty-two successive input data words of the input data stream. For example, if the fourteenth input data word includes at least one non-zero bit, the fourteenth input data word is stored in the binary array register 22, and the fourteenth bit in the control word is set to non-zero or binary one. If all thirty-two successive input data words include at least one non-zero bit, all thirty-two input data words are stored in the register 22, and all of the bits of the control word are marked with a logical one value. If the fifteenth data word is formed of all-zero bits, the fifteenth data word is not stored in the register 22, or anywhere else, and a binary zero is written into the fifteenth bit position in the control word. If all of the input data words are formed of all-zero bits, no data words are stored in the register 22 and the control word is formed of all logical zero bits. Thus, the control word also forms a binary array index for indexing the data words stored in the binary array register 22. For example, if the control word contains a logical one at bit positions 3, 8, 9, 10, 14, 20, 21 and 22, then register 22 stores in sequence the third, eighth, ninth, tenth, fourteenth, twentieth and twenty-first data words. All other bit positions of the control are zero, and the data words corresponding to those bit positions are not stored as they contain all zero bits.

The data words, if any, stored in the binary array register 22 are concatenated, or otherwise linked, to the control word and the control word together with the data words contained in the binary array register 22 together form the compressed data stream generated on the output line 28. The concatenation of the control word and data words stored in the register 22 is represented in the figure by the summation block 26.

Compression of the input data stream occurs when an entire input data word is formed of all zero bits. When the processing device 18 determines that an input data word contains all zero bits, the data word is not transferred to the binary array register 22. As a result, the compressed data stream 28 does not include data words which are formed of all zero bits. The compression circuit 10 is therefore operative to remove large groups of all-zero bits.

The processing device 18 can determine whether an input data word contained in the input register 16 contains non-zero bits, can transfer the input data word to the binary array register 22, and can mark an appropriate bit of the control word contained in the register 24 in only a very small number of processing steps. Because only a small number of processing steps is required, the compression circuit 10 is operative to compress an input data stream into a compressed data stream very quickly.

FIG. 2 illustrates a decompression circuit, shown generally at 34, operative to decompress a compressed data stream, such as the compressed data stream generated on line 28 by the compression circuit 10 shown in FIG. 1.

The compressed data stream is supplied to the circuit 34 on the line 38 whereat the data words of the compressed data stream are applied to a register 42. The register 42 includes a control word buffer 44 and a binary array buffer 46. The buffers 44 and 46 are separately illustrated in the figure to indicate that the control word stored in the control word buffer 44 is accessed by a processing device 48 while the data words concatenated to the control word are applied to an output buffer 52.

The processing device 48 is operative to determine the binary value of each bit in the control word. When a bit of the control word is of a logical one value, the processing device 48 causes a data word stored in the binary array buffer 46 to be transferred to the output buffer 52. The data words in the binary array buffer 46 are stored in the same sequence as the logical one's in the control word. Thus, when the first binary one bit (irrespective of bit position) is detected, the first data word is transferred to the output buffer 52. The second binary one transfers the second data word from the array buffer, and so on. If the control word bit being processed is a logical zero value, the processing device 48 causes a zero bit generator 54 to generate a word formed of all binary zero values to be transferred to the output buffer 52.

Accordingly, binary values of successive bits of the control word are determined by the processing device 48, and either a data word stored in the binary array buffer 46 or an all-zeros data word generated by the zero bit generator 54 is supplied to the output buffer 52. A decompressed data stream is thereby formed which can be generated on the output line 56.

Because the number of bits of a control word, which are of logical one value, is determinative of the number of successive data words prior to a next succeeding control word, a count of the number of logical one bits in a first control word is determinative of the location of a next succeeding control word. Therefore, with very little processing of an incoming serial bit stream, the decompression circuit 34 is operative to decompress data into a decompressed form.

FIG. 3A illustrates an example of an uncompressed, input data stream, shown generally at 62, and FIG. 3B illustrate a corresponding, compressed data stream, shown generally at 64. The compressed data stream 64 is generated by the compression circuit 10 shown in FIG. 1 responsive to application of the data stream 62 thereto. Analogously, the decompressed data stream 62 is generated by the decompression circuit 34 shown in FIG. 2 responsive to application thereto of the compressed data stream 64.

The input data stream 62 includes thirty-two data words wherein successive ones of the data words are listed in vertically-extending rows. Each of the data words is identified by a row number 1–32.

Each input data word is formed of thirty-two bits. At least one bit of the first, fifth, thirtieth, and thirty-second data words of the example shown in FIG. 3A includes at least one non-zero, or binary one value, bit.

Comparison of the data stream 62 and the data stream 64 indicates that the first, fifth, thirtieth, and thirty-second input data words of the input data stream form portions of the output data stream 64. The first word of the output data stream 64 is a control word 66. The input data words of the input data stream 62 which include non-zero bits are concatenated to the control word 66.

Bits of the control word 66 which are marked with a logical one value indicate the positioning of the data words concatenated to the control word 66. In essence, the control word 66 forms an index for indexing the positioning of the binary words which are concatenated to the control word. By proper interpretation of the control word, subsequent decompression of the compressed data stream is possible. With respect to the example illustrated in the figure, the first, the fifth, the thirtieth, and the thirty-second bits of the control word are marked with logical one values. The data words concatenated to the control word 66 are identified as being the first, the fifth, the thirtieth, and the thirty-second data words when the compressed data stream is subsequently decompressed. Signal bits of the control word 66 which are of zero values indicate corresponding data words formed of all zero values.

To illustrate the operation of the compression circuit 10, the input data stream 62 is compressed to form the compressed data stream 64. The first input data word of the input data stream 62 includes non-zero bits, and responsive to such a determination, the processing device 18 marks the first bit of a control word formed in the control word register 24 with a logical one value and transfers the input data word to the binary array register 22.

The succeeding input data word is thereafter input into the input register 16. The processing device 18 determines whether the data word includes any non-zero bits. In the example, the second input data word does not includes only binary zero bits, so the input data word is not transferred to the binary array register 22, and the second bit of the control word formed in the control word register 24 is marked with a zero bit. Successive ones of the input data words are input into the register 16, and signal bits of the control word are appropriately marked. The input data words containing non-zero bits are also transferred to the binary array register 22.

To illustrate the operation of the decompression circuit 34, a compressed data stream, such as the compressed data stream 64, is applied to the circuit 34 and the control word and data words concatenated thereto are stored in the register 42. The processing device 48 is operative to determine the values of the bits of the control word. When the control word is of a logical one value, the processing device causes a data word associated therewith to be transferred to the output buffer 52. In the example illustrated in FIG. 3, the first signal bit of the control word is of a logical one value, and the first data word concatenated to the control word is transferred to the output buffer 52. When the bit of the control word is of a logical zero value, the processing device 48 causes the zero bit generator 54 to transfer a word formed entirely of zero bits to the output buffer 52. In the example illustrated in FIG. 3, the second, third, and fourth bits of the control word are of zero values. Responsive to a determination that the bits are of zero values, three words, comprised solely of zero values, are transferred to the output buffer 52. In such manner, a decompressed data stream having signal values corresponding to the signal values of the data stream 62 is thereby recreated.

FIG. 4 illustrates a printer system, shown generally at 72, which advantageously utilizes compression and decompression techniques of the present invention. It should be noted, of course, that the compression and decompression techniques may be utilized in any of many other types of applications.

In the embodiment illustrated in FIG. 4, the printer system 72 is operative in conjunction with files formatted by a printer definition language, such as a Postscript (tm), PCL (tm), or AFPDS (tm) printer definition language. The files are here illustrated as stored at a storage element 76. The files define print images which can be printed during operation of the printer system.

Files stored at storage element 76 are supplied to a host computer interpreter and rasterizer 78 by way of lines 82. The interpreter and rasterizer 78 interprets the files supplied to it and generates bit maps of the files received thereat. The values of the bit map are determinative of a printed image to be generated in raster fashion by the printer system.

Conventionally, the bit map for each printer image is of a very large size, oftentimes on the order of two to three megabytes of data. When numerous print images are to be generated, the amount of memory, here represented by an image raster buffer 84, to store the bit maps associated with each of the printer images can quickly become quite significant. Through operation of the compression technique of the present invention, the size of the bit map can be significantly reduced. Compaction ratios as great as five to one have been evidenced in operation of the compression technique of the present invention to compress rasterized images. As a result of such reduction, the size of the memory which must be allocated to store the bit maps can be correspondingly reduced.

The printer system 72 further includes a printer control unit 88 coupled to the interpreter and rasterizer 78 by way of the line 92. A print data stream is generated upon the line 92 containing the data of the bit maps generated by the interpreter and rasterizer 78 and stored in the buffer 84. The print data stream contains compressed data which can be stored in an image raster buffer 94 coupled to the printer control unit 88 or can be immediately decompressed by the decompression technique of the present invention. Because only a small amount of processing is required to decompress the data, the data can be decompressed "on the fly", that is, as it is received and output to print head printing bits, now dots, on the printed page 96.

If stored in the image raster buffer 94, the print data stream may later be decompressed, when desired. Once decompressed, the printer control unit effectuates the generation of printing of the data onto a print media, here to form one or more printed pages 96.

Because the compression and decompression techniques require little processing to compress and later decompress digital data, compressed data and decompressed data can be generated very quickly. A print resource can decompress compressed data applied thereto "on the fly" to quickly generate a print output of a print data stream applied thereto. The printer does not have to wait for a print line of data to be decompressed. The print line of data is decompressed while the print head is raster scanning the line on the page being printed. And, when data must be stored in a memory element, the amount of memory space required to store the data, once compressed, is much smaller than the memory space required to store the corresponding data in uncompressed form.

FIG. 5 is a flow diagram, shown generally at 102, which illustrates a method for effectuating data compression according to an embodiment of the present invention. A binary data stream containing words of digital data is compressed to form a compressed data stream. The method illustrated in FIG. 5 illustrates the method effectuated by the host rasterizer 78 of the printer system 72 shown in FIG. 4 to compress a data stream forming a bit map. The bit map is formed of thirty-two bit words wherein sequential ones of the digital words together define print-buffer raster-scan lines.

First, and as indicated by the block 104, a word of a print buffer scan line is read. Next, and as indicated by the block 106, a word counter is incremented. If, as indicated by the decision block 108, the word counter is of a count value of less than thirty-two, a yes branch is taken to a decision block 112 whereat a determination is made as to whether the digital word includes a non-zero bit.

If so, the yes branch is taken to block 114, and a bit in a control word associated with the digital word is turned on. Preferably, the bit position of the bit which is turned on corresponds to the counter value of the word counter. Thereafter, the digital word including the non-zero bit is placed in a print output buffer, as indicated by the block 116.

If a determination is made at the decision block 108 that the counter value of the word counter is not less than thirty-two, the no branch is taken and a pointer is moved to the end of a buffer in which compressed printer data is stored, as indicated by block 118.

If, at the decision block 112, a determination is made that the digital word does not include any non-zero bits, the no branch is taken from the decision block 112 back to the block 104 and a succeeding word of the print buffer scan line is read. The bit value of the bit of a control word associated with the digital word is not turned on and the digital word, containing only zero values, is not stored in a print output buffer.

FIG. 6 is a flow diagram, shown generally at 122 which illustrates a method of operation of the printer control unit 88 shown in FIG. 4 to decompress the compressed print data stream applied thereto. The method is operative to decompress data compressed according to the method illustrated in the flow diagram 102 shown in FIG. 5.

First, and as indicated by the block 124, the control word is read. Next, and as indicated by the block 126, a shift counter is incremented. Then, as indicated by the decision block 128, a determination is made as to whether or not the shift counter is of a count value less than thirty-two. If not, a no branch is taken back to the block 124. Otherwise, the yes branch is taken to the block 132, and a shift register is shifted left one bit and the bit value of the control word is tested. A determination is made at the decision block 134 as to whether the bit is on (i.e., a logical "one" value). If not, the no branch is taken to block 136, and a zero word is moved into the print buffer. Then, a branch is taken back to the block 126. If the bit is of a logical one value, the yes branch is taken from the decision block 134 and the digital word is moved from the input buffer into the print buffer as indicated by the block 138. Then, a branch is taken back to the block 126.

Because the compression and decompression technique of the present invention can be effectuated with very little processing time, compression and decompression of digital data can be effectuated quickly. Once data is compressed, the data can be stored in a memory element requiring far less memory space than the amount of memory space required to store the corresponding digital data in uncompressed form. Because the compressed data can be decompressed quickly, a compressed data stream can be decompressed "on the fly", when desired.

Presently-preferred embodiments of the present invention have been described with a degree of particularity. The previous descriptions are of preferred examples for implementing the invention, and the scope of the invention should not necessarily be limited by this description. The scope of the present invention is defined by the following claims.

What is claimed is:

1. A data compression and decompression method for compressing and then decompressing an input data stream that is formed of at least one input digital word, each input digital word formed of at least one signal bit, said input data stream being compressed into a compressed data stream that is formed of at least a control word, and said compressed data stream being decompressed to form an output data stream corresponding to said input data stream, said method comprising the steps of:

determining individual bit values of the signal bits of the input digital words of the input data stream;

when an input digital word of the input data stream includes at least one bit of a first logical value, concatenating the input digital word to the compressed data stream to form a portion thereof; and marking a bit of the control word associated with the input digital word with a first selected value, each bit of the control word associated with a different input digital word of the input data stream;

when an input digital word of the input data stream includes bits of only a second logical value, marking the bit of the control word associated with the input digital word with a second selected value, thereby to form the compressed data stream of the control word and input digital words having at least one bit of the first logical value;

reading the control word of the compressed data stream;

determining which bits of the control word are of the first selected value and which bits of the control word are of the second selected value;

when the bit of the control word is of the first selected value, reading an associated concatenated digital word of the compressed data stream, the associated concatenated digital word forming an output digital word of the output data stream; and when the bit of the control word is of the second selected value, generating an output digital word formed of bits which are all of a second logical value, thereby to form the output data stream of digital words corresponding to the input data stream.

2. A data compression method for compressing an input data stream formed of at least one input digital word into a compressed data stream formed of at least a control word, each input digital word formed of at least one signal bit, said method comprising the steps of:

determining individual logical bit values of the signal bits of the input digital words of the input data stream;

when an input digital word of the input data stream includes at least one bit of a first logical value concatenating the input digital word to the compressed data stream to form a portion thereof; and marking a bit of the control word associated with the input digital word with a first selected value, each bit of the control word being associated with a different input digital word of the input data stream; and when an input digital word of the input data stream includes bits of only a second logical value, marking the bit of the control word associated with the input digital word with a second selected value, thereby to form the compressed data stream of the control word and concatenated input digital words having at least one bit of the first logical value.

3. The method of claim 2 wherein said step of determining the logical bit values of the signal bits of the input digital words comprises serially reading the input digital words of the input data stream.

4. The method of claim 2 wherein said steps of concatenating the input digital word to the compressed data stream and marking the associated bit of the control word with the first selected value are performed when the input digital word includes at least one bit of a non-zero logical value.

5. The method of claim 2 wherein said step of marking the associated bit of the control word with the second selected value is performed when the input digital word includes bits of only zero logical values.

6. The method of claim 2 wherein the input data stream is formed of a plurality of input digital words and wherein a separate bit of the control word is associated with successive ones of the input digital words of the input data stream.

7. The method of claim 2 wherein said step of marking the associated bit with the first selected value is performed when the input digital word includes at least one bit of the first logical value, and comprises the step of marking the associated bit with a non-zero value.

8. The method of claim 2 wherein said step of marking the associated bit with the second selected value is performed when the input digital word includes the bits of only the second logical value, and comprises the step of marking the bit with a zero value.

9. The method of claim 2 comprising the further step of storing the compressed data stream in a storage device.

10. The method of claim 2 further comprising the introductory step of generating the input data stream.

11. The method of claim 10 wherein said step of generating the input data stream comprises the step of interpreting files formatted by a printer definition language Which define print images.

12. The method of claim 11 wherein said step of generating the input data stream further comprises the step of rasterizing the files interpreted during said step of interpreting, thereby to form the input data stream.

13. The method of claim 2 comprising the further step of decompressing the compressed data stream.

14. A data decompression method for decompressing a compressed data stream that including digital words and a control word having a plurality N of bits, to form an uncompressed output data stream formed of a plurality N of output digital words, said method comprising the steps of:

determining which bits of the control word are of a first selected value and which bits of the control word are of a second selected value;

when the bit of the control word is of the first selected value, reading a digital word of the compressed data stream, the read digital word forming an output digital word of the output data stream; and when the bit of the control word is of the second selected value, generating an output digital word that is formed of bits, all of second logical values, thereby to form the output data stream of digital words that are responsive to values of the bits of the control word.

15. Circuitry for compressing an input data stream formed of a plurality N of input digital words, each input digital word formed of at least one signal bit, into a compressed data stream formed of uncompressed input digital words and a control word having N bits, said circuitry comprising:

a bit value-determining device for determining individual values of the signal bits within each one of the N input digital words of the input data stream; and a compressed data stream generator operative responsive to signal bit values determined by said bit value-determining device, said compressed data stream generator for marking an associated bit of the control word with a first selected value and concatenating the input digital word to the compressed data stream when the input digital word of the input data stream includes at least one bit of a first logical value, and for marking the associated bit of the control word with a second selected value when the input digital word includes bits of only a second logical value.

16. The circuitry of claim 15 wherein said bit value-determining device comprises an input register for receiving an input digital word, and a processing device for determining the values of the, bits of the input digital word received at said input register.

17. The circuitry of claim 16 wherein said compressed data stream generator is operative responsive to the determinations of said processing device relative the values of the bits of the input digital words received at the input register.

18. The circuitry of claim 15 wherein said compressed data stream generator comprises a processing device, said processing device for marking the control word with the first or the second selected value, respectively, and for concatenating each input digital word that includes at least one bit of the first logical value to the compressed data stream.

19. The circuitry of claim 15 wherein the circuitry is further operative to decompress the compressed data stream and wherein said circuitry further comprises a decompression circuit for decompressing the compressed data stream.

20. Apparatus for compressing an input-data-stream having a plurality N of input-words, each of said input-words containing a plurality of binary-bits, said apparatus operating to compress said input-data-stream into an output-data-stream having (1) a control-word containing said plurality N of binary-bits, and (2) a number of said input-words, said number of input-words in said output-data-stream being determined by a binary-state of said binary-bits contained in each one of said plurality N of input-words, said apparatus comprising:

bit-state-determining means for determining said binary state of said binary-bits within each one of said plurality N of input-words, and output-data-stream generator means responsive to said bit-state-determining means;

said output-data-stream generator means responding to a determination that a given input-word includes at least one binary-bit of a first binary-state, and operating in response thereto to (1) concatenate said given input-word to said output-data-stream, and (2) set an associated binary-bit of said control-word to a given binary-state, and said output-data-stream generator means responding to a determination that a given input-word includes only binary-bits of a second binary-state, and operating in response thereto to (1) set an associated binary-bit of said control-word to a binary-state that is opposite said given binary-state;

whereby said output-data-stream contains (1) said control-word having said plurality N of binary-bits wherein each of said binary-bits corresponds to a different one of said plurality N of input-words, and (2) said number of concatenated input-words, each of which is identical to those input words that have at least one bit of said first binary-state.

* * * * *